(12) United States Patent
Cho et al.

(10) Patent No.: US 6,638,823 B2
(45) Date of Patent: Oct. 28, 2003

(54) ULTRA SMALL SIZE VERTICAL MOSFET DEVICE AND METHOD FOR THE MANUFACTURE THEREOF

(75) Inventors: Wonju Cho, Taejon (KR); Seong Jae Lee, Taejon (KR); Kyoung Wan Park, Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 0 days.

(21) Appl. No.: 09/975,963

(22) Filed: Oct. 15, 2001

(65) Prior Publication Data

US 2002/0140032 A1 Oct. 3, 2002

(30) Foreign Application Priority Data

Mar. 28, 2001 (KR) .................................... 2001-0016190

(51) Int. Cl.[7] .......................................... H01L 21/8242
(52) U.S. Cl. ...................................... 438/268; 438/156
(58) Field of Search ................................ 438/268, 197, 438/156, 151

(56) References Cited

U.S. PATENT DOCUMENTS

| 5,365,097 | A | | 11/1994 | Kenney |
| 5,382,816 | A | | 1/1995 | Mitsui |
| 5,872,037 | A | * | 2/1999 | Iwamatsu et al. |
| 6,300,198 | B1 | * | 10/2001 | Aeugle et al. |

FOREIGN PATENT DOCUMENTS

| JP | 7-099311 | 4/1995 | ........... H01L/29/78 |
| JP | 8-227997 | 9/1996 | ........... H01L/29/78 |
| JP | 10-189764 | 7/1998 | ....... H01L/21/8238 |
| JP | 2000-174269 | 6/2000 | ........... H01L/29/78 |

OTHER PUBLICATIONS

Hergenrother, et al.; The Vertical Replacement–Gate (VRG) MOSFET: A 50–nm . . . ; 1999 IEEE; pp. 99–75–99–78.

Hergenrother, et al.; *The Vertical Replacement–Gate (VRG) MOSFET Wtih* . . . ; *2000 Extended* Abstract of . . . ; pp. 220–221.

* cited by examiner

*Primary Examiner*—Long Pham
(74) *Attorney, Agent, or Firm*—Jacobson Holman PLLC

(57) ABSTRACT

The present invention relates to an ultra small size vertical MOSFET device having a vertical channel and a source/drain structure and a method for the manufacture thereof by using a silicon on insulator (SOI) substrate. To begin with, a first silicon conductive layer is formed by doping an impurity of a high concentration into a first single crystal silicon layer. Thereafter, a second single crystal silicon layer with the impurity of a low concentration and a second silicon conductive layer with the impurity of the high concentration are formed on the first silicon conductive layer. The second single crystal silicon layer and the second silicon conductive layer are vertically patterned into a predetermined configuration. Subsequently, a gate insulating layer is formed on entire surface. Then, an annealing process is carried out to diffuse the impurities in the first silicon conductive layer and the second silicon conductive layer into the second single crystal layer, thereby forming a source region, a drain region and a vertical channel. Finally, a gate electrode is formed on side walls of the vertical channel.

7 Claims, 9 Drawing Sheets

ULTRA SMALL SIZE VERTICAL MOSFET DEVICE AND METHOD FOR THE MANUFACTURE THEREOF

FIELD OF THE INVENTION

The present invention relates to a MOSFET (metal oxide semiconductor field effect transistor) device; and, more particularly, to an ultra small size vertical MOSFET device having a vertical channel and a source/drain structure and a method for the manufacture thereof by using a silicon on insulator (SOI) substrate.

DESCRIPTION OF THE PRIOR ART

In a silicon device technology, it is necessary to reduce a length of a channel, a depth of metallurgical junction at source and drain contact and a thickness of an effective gate insulating layer for achieving the silicon device with a low voltage, a high integration and a high speed drivability. Additionally, it is required the device with a high performance characteristic by an increase of a driving current and a decrease of a leakage current among the same size of the devices.

However, it has lot of obstacles to manufacture a nano-scale silicon device with a high performance by using a conventional manufacturing method. That is, in case of manufacturing a planar channel of a nano-scale by the conventional method, a special patterning method such as an e-beam direct writing method or x-ray lithography method should be used. But it is impossible to manufacture the nano-scale silicon device in large quantities because the e-beam direct writing method and x-ray lithography method are not definite techniques up to now. Furthermore, since it is not only difficult to fabricate the nano-scale device with shallow source/drain junction depth using a single crystal silicon material but an electrical isolation property may also be deteriorated, there are difficulties in fabricating the device with the low voltage drivability. Thus, in order to overcome the above problems, very complicated manufacturing processes are required.

One conventional method for manufacturing a vertical MOS transistor is disclosed by Mitsui in U.S. Pat. No. 5,382,816, "Semiconductor Device Having Vertical Transistor with Tubular Double Gate". In accordance with this method, a first gate and a second gate are formed the interior and the exterior of the vertical channel. Thus, a threshold voltage may be controlled by applying voltage to each gate. However, this method has drawbacks that a structure of the MOS transistor is too complicated and further, a plurality of lithography, deposition and etch processes are required. Additionally, it is hard to downsize the device because it is difficult to secure a process margin.

Another conventional method for manufacturing a vertical MOS transistor is disclosed by Kenney in U.S. Pat. No. 5,365,097, "Vertical Epitaxial SOT transistor, Memory Cell and Fabrication Methods". In a disclosure, a trench is formed on an SOI substrate and a silicon epi layer is deposited in the trench. Therefore, a memory cell and the MOS transistor fabricated integrally. However, the MOS transistor having the vertical silicon channel in accordance with this conventional method has disadvantages as follows: first, it is difficult to secure a process margin owing to a complicated structure of the device; second, it is hard to fabricate the device in the trench of a micro size; third, it is difficult to grow up a single crystal silicon epi layer on a poly-crystal silicon; fourth, it is difficult to form a p-n junction on the channel of the single crystal and a diffusion layer of the poly-crystal; fifth, since source/drain regions are formed on the channel of the single crystal and a diffusion layer of the poly-crystal, the junction leakage of source/drain regions increases, besides a reliability and an insulating property of a gate insulating layer may be deteriorated.

The other conventional method for manufacturing a vertical MOS transistor is disclosed by J. M. Hergenrother in an article, "The Vertical Replacement-Gate MOSFET, IEDM 99, pp. 75–78, Dec. 1, 1999". In the article, the method comprises the steps of forming a trench using a single crystal silicon substrate, forming a vertical channel by growing up the single crystal silicon epitaxially, forming a gate enclosing the channel, and forming a source/drain over and below the gate. According to this method, in order to fabricate the MOS transistor having the vertical silicon channel, complicated manufacturing steps should be carried out. Namely, a trench is formed interior of an insulating layer, first of all. Thereafter, the single crystal silicon epi layer is formed in the trench. Finally, the source/drain is formed. Therefore, it has problems that the manufacturing processes are too complicated and further, it is difficult to interconnect among the unit devices.

As described above, in accordance with the conventional methods, an isolation step is required due to a use of the bulk silicon. Moreover, stringent manufacturing conditions are needed in order to reduce the length of the channel. That is, because it is impossible to form the channel of the nanometer size horizontally by using a conventional photolithography, the e-beam direct writing method or x-ray lithography method should be employed. Although the e-beam direct writing method or x-ray lithography method is used, it is difficult to manufacture the device of nano-meter size in large quantities. The lithography technique is not established in order to manufacture the device of the nanometer size still now. In addition, the conventional method using the silicon single crystal has large problems for forming shallow source/drain junction, ensuring a reliability of the nanometer scale device and isolation of each device electrically.

SUMMARY OF THE INVENTION

It is, therefore, an object of the present invention to provide an ultra small size vertical MOSFET (metal oxide semiconductor field effect transistor) device having a vertical channel and a source/drain structure by applying a diffusion process without additional lithography steps.

It is another object of the present invention to provide a method for manufacturing an ultra small size vertical MOSFET device having high drive current by increasing the channel width in the same chip area.

In accordance with one aspect of the present invention, there is provided the ultra small size vertical MOSFET device, comprising: a silicon on insulator (SOI) substrate including a single crystal substrate, an oxide layer formed upon the single crystal substrate and a first single crystal silicon layer formed upon the oxide layer; a first silicon conductive layer formed by doping an impurity of a high concentration into the first single crystal silicon layer; a source region, a channel and a drain region formed on the first silicon conductive layer; a gate insulating layer formed on the first silicon conductive layer, the source/drain regions and the channel; a second silicon conductive layer formed on the drain contact; and a gate electrode formed on side walls of the channel.

In accordance with another aspect of the present invention, there is provided a method for manufacturing an ultra small size vertical MOSFET device, the method comprising the steps of: a) preparing an SOT substrate including a single crystal substrate, an oxide layer formed upon the single crystal substrate and a first single crystal silicon layer formed upon the oxide layer; b) forming a first silicon conductive layer by doping an impurity of a high concentration into the first single crystal silicon layer; c) forming a second single crystal silicon layer and a second silicon conductive layer on the first silicon conductive layer, wherein the second single crystal silicon layer has the impurity of a low concentration and the second silicon conductive layer has the impurity of a high concentration; d) patterning the second silicon conductive layer and the second single crystal silicon layer vertically into a first predetermined configuration; e) forming a gate insulating layer on the first silicon conductive layer, the second single crystal silicon layer and the second silicon conductive layer; f) carrying out an annealing process to diffuse the impurities in the first silicon conductive layer and the second silicon conductive layer into the second single crystal layer, thereby forming a source region, a drain region and a vertical channel; and g) forming a gate electrode on side walls of the vertical channel, wherein the gate electrode encompasses the channel.

BRIEF DESCRIPTION OF THE DRAWINGS

The above and other objects and features of the present invention will become apparent from the following description of the preferred embodiment given in conjunction with the accompanying drawings, in which.

DETAILED DESCRIPTION OF THE PREFERRED EMBODIMENTS

Figure 1:
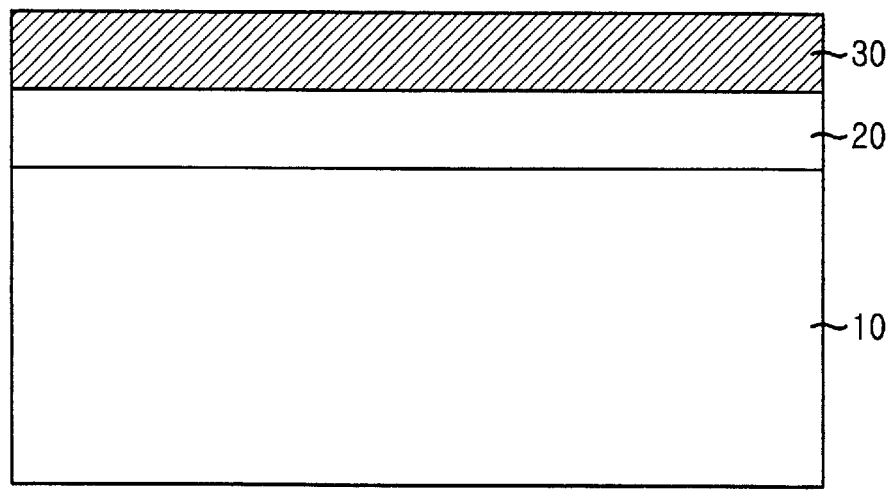
FIGS. 1 to 11 show cross sectional views setting forth an ultra small size vertical MOSFET (metal oxide semiconductor field effect transistor) device and a method for the manufacture thereof in accordance with the present invention.

There are provided in FIGS. 1 to 11 cross sectional views setting forth an ultra small size vertical MOSET (metal oxide semiconductor field effect transistor) device and a method for the manufacture thereof in accordance with a preferred embodiment of the present invention. It is noted that the same reference numerals are used throughout multiple figures to designate the same components.

Figure 11:
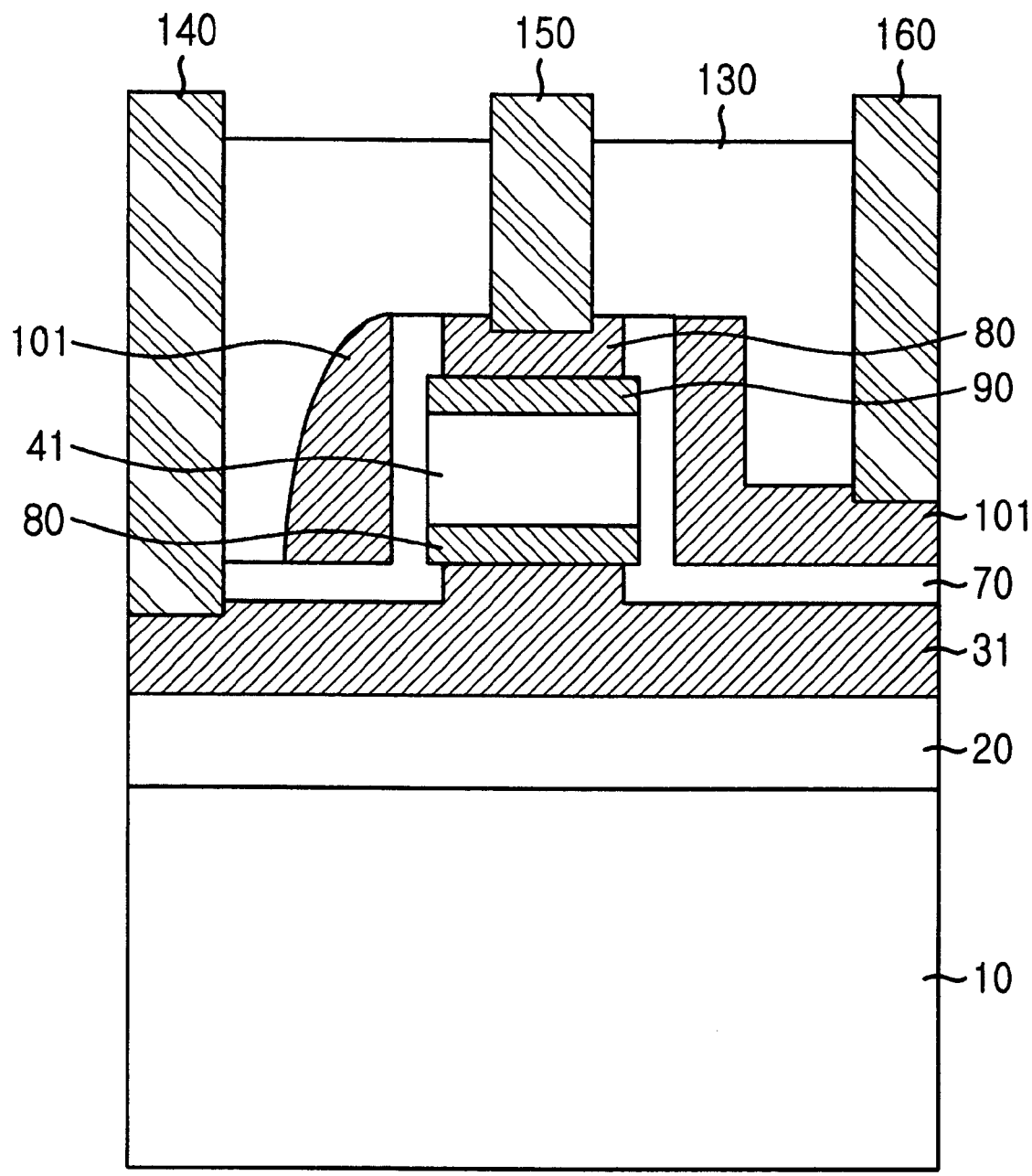

In FIG. 11, there is provided a cross sectional view of the inventive ultra small size vertical MOSFET device comprising an SOI (silicon on insulator) substrate, a channel 41, a source region 80, a drain region 90, a second silicon conductive layer 50, a gate insulating layer 70, a gate electrode 101, an interlayer dielectric (ILD) layer 130, a source interconnection 140, a drain interconnection 150 and a gate electrode interconnection 160. The SOT substrate includes a single crystal substrate 10, an oxide layer 20 formed upon the single crystal substrate 10 and a first silicon conductive layer 31 formed upon the oxide layer 20.

The first silicon conductive layer 31 is formed by doping an impurity of a high concentration into a single crystal silicon layer using a method such as an ion implantation, plasma doping or some diffusion techniques, wherein the impurity material includes a p-typed material or an n-typed material such as boron (B), phosphorus (P) or the like.

In order to achieve the channel 41, a source region 80 and a drain region 90, a second single crystal silicon layer and a second silicon conductive layer 50 are formed on the first silicon conductive layer 31, first of all. Thereafter, the second silicon conductive layer 50 and the second single crystal silicon layer are patterned. At this time, the second single crystal silicon layer is formed by using a method such as a chemical vapor deposition (CVD) or a molecular beam epitaxy (MBE) technique. And the second silicon conductive layer is made of an amorphous silicon or a poly-crystal silicon by the CVD technique.

Then, the gate insulating layer 70 is formed on the patterned layers and the first silicon conductive layer, wherein the gate insulating layer is made of a thermal oxide layer, a nitride layer, a CVD oxide layer and a CVD nitride layer.

Since the second single crystal silicon layer has the impurity of a low concentration and the second silicon conductive layer 50 has the impurity of a high concentration, the impurities existing in the first and the second silicon conductive layers 31, 50 diffuse into the second single crystal silicon layer by an annealing process, thereby obtaining the source region 80, the channel 41 and the drain region 90. It is preferable that the annealing process should be carried out at a temperature ranging from approximately 700 to approximately 1,000 in an electrical furnace or a rapid thermal annealing (RTA) furnace.

The gate electrode 101 is achieved by forming a third silicon conductive layer and patterning into a predetermined configuration using a dry etch process. Then, an ILD layer 130 is formed on entire surfaces and patterned, whereby a source, a drain and a gate electrode contact holes are formed. Thereafter, a metal or a silicon conductive layer is deposited into the contact holes, thereby completing a source interconnection 140, a drain interconnection 160 and a gate electrode interconnection 150.

FIGS. 1 to 11 are schematic cross sectional views setting forth the method for manufacture of an ultra small size vertical MOSFET device in accordance with the present invention.

Referring to FIG. 1, the manufacturing process begins with the preparation of an SOI substrate in which an oxide layer 20 and a first single crystal silicon layer 30 is formed on a single crystal substrate 10, sequentially.

Figure 2:
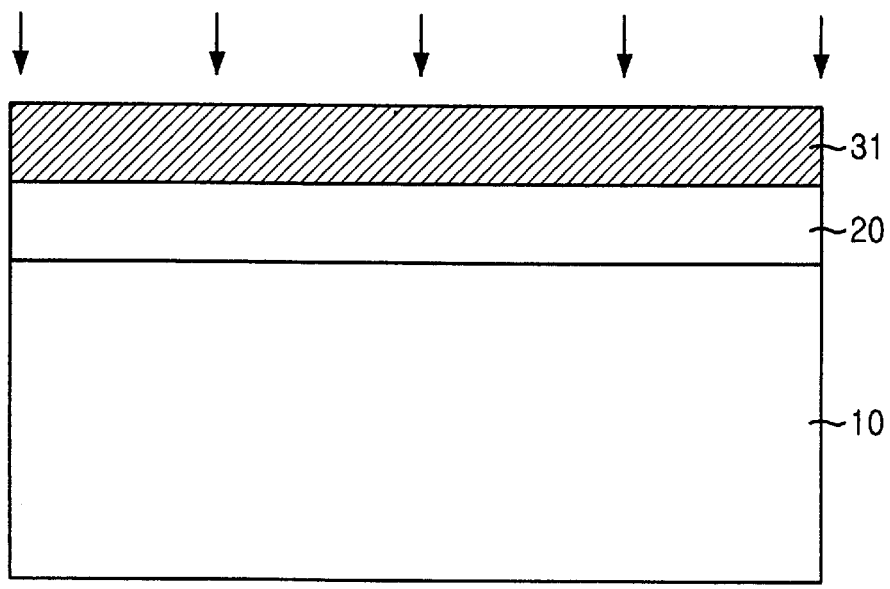

Thereafter, referring to FIG. 2, the first single crystal silicon layer 30 is doped with an impurity of a high concentration using a method such as an ion implantation or a vapor diffusion technique so that a first silicon conductive layer 31 is obtained, wherein the impurity material includes a p-typed or an n-typed material such as boron (B), phosphorus (P) or the like.

Figure 3:
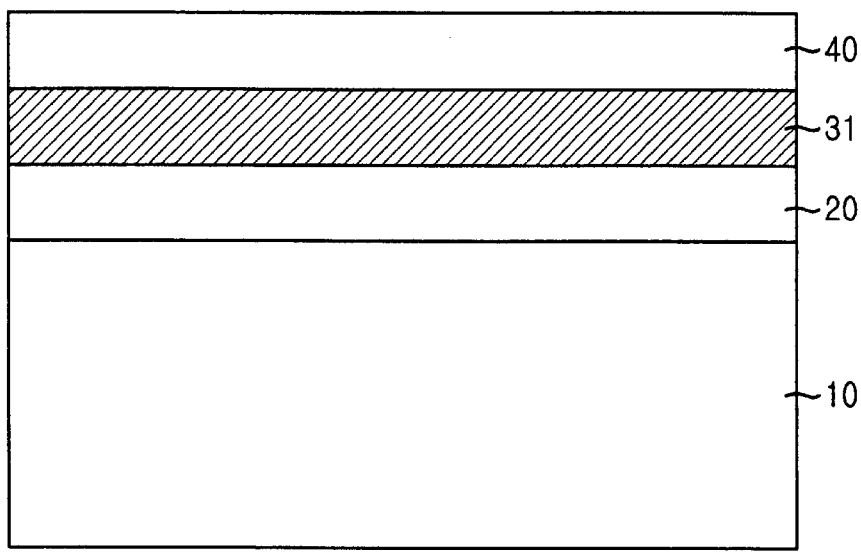

In a next step as illustrated in FIG. 3, a second single crystal silicon layer 40 with the impurity of a low concentration is formed on the first silicon conductive layer 31 by using a method such as a CVD or a MBE technique.

Figure 4:
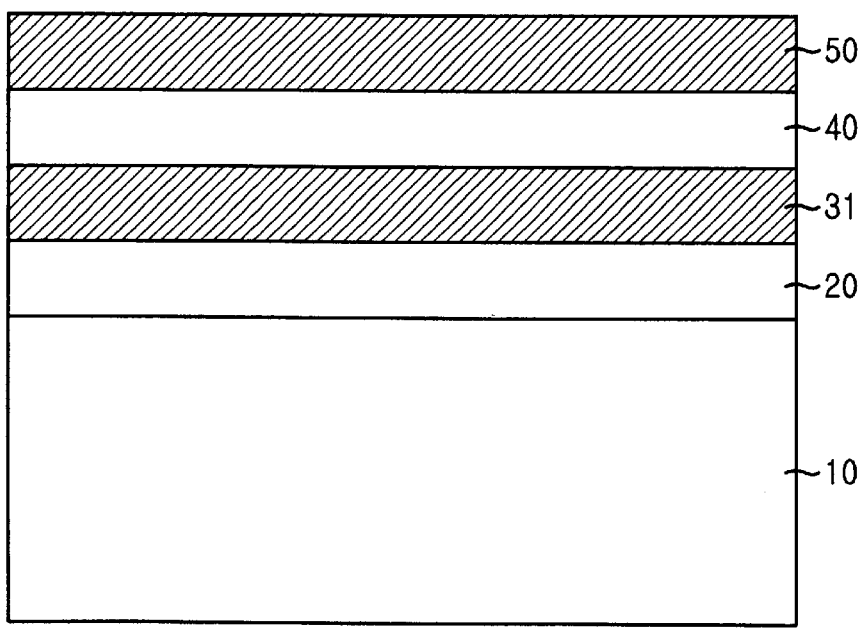

In an ensuing step as shown in FIG. 4, a second silicon conductive layer 50 with the impurity of a high concentration is formed on the second single crystal silicon layer 40. Here, the second silicon conductive layer 50 is made of an amorphous silicon or a poly-crystal silicon having the impurity material such as the p-typed or the n-typed material by using the CVD technique.

Figure 5:
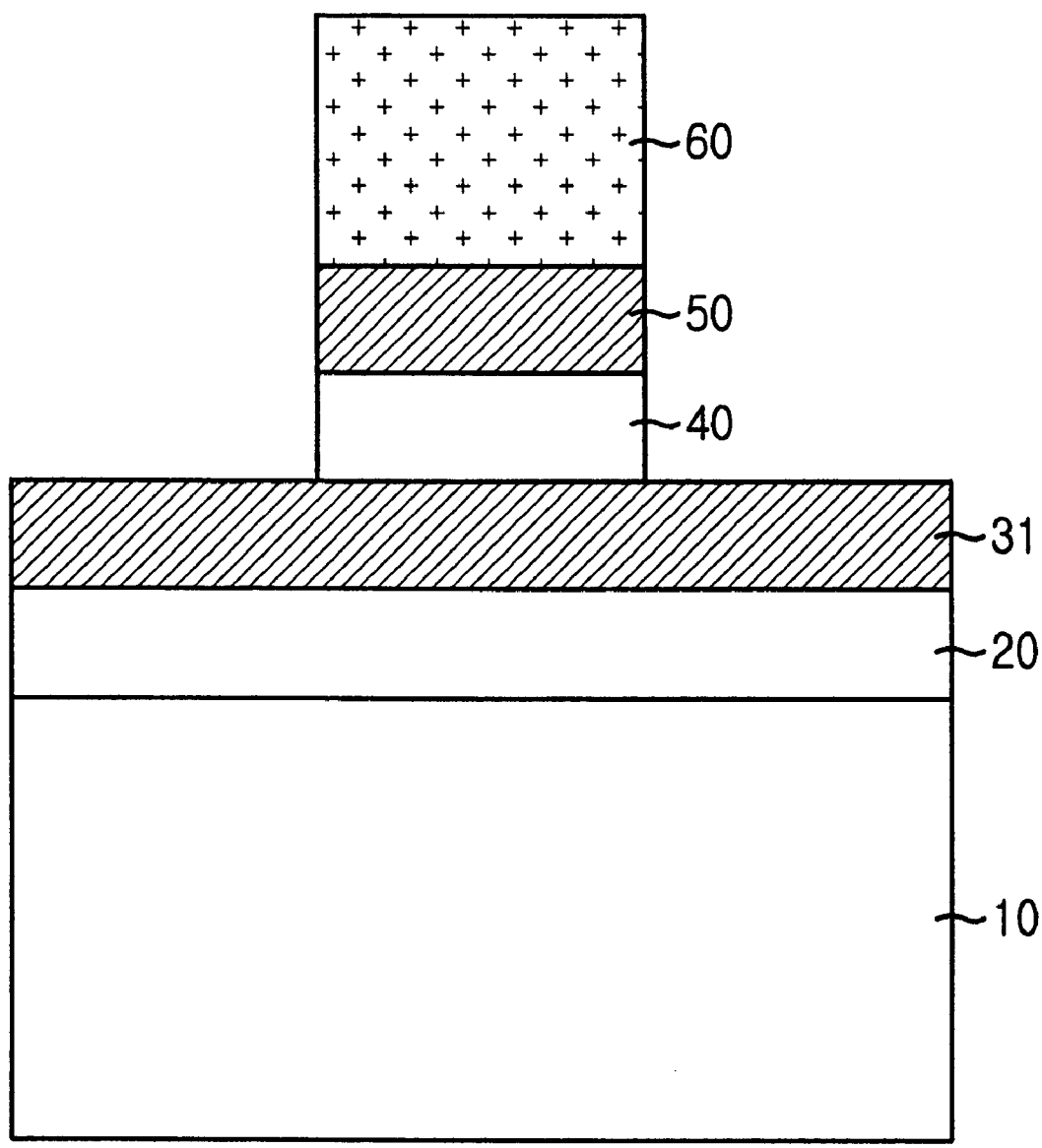

Subsequently, an etch mask 60 is formed on the second silicon conductive layer 50. Then, the second single crystal silicon layer 40 and the second silicon conductive layer 50 are vertically patterned into a first predetermined configuration by using a dry etch process, as shown in FIG. 5. The etch mask 60 includes a photoresist, oxide or nitride layer.

Figure 6:
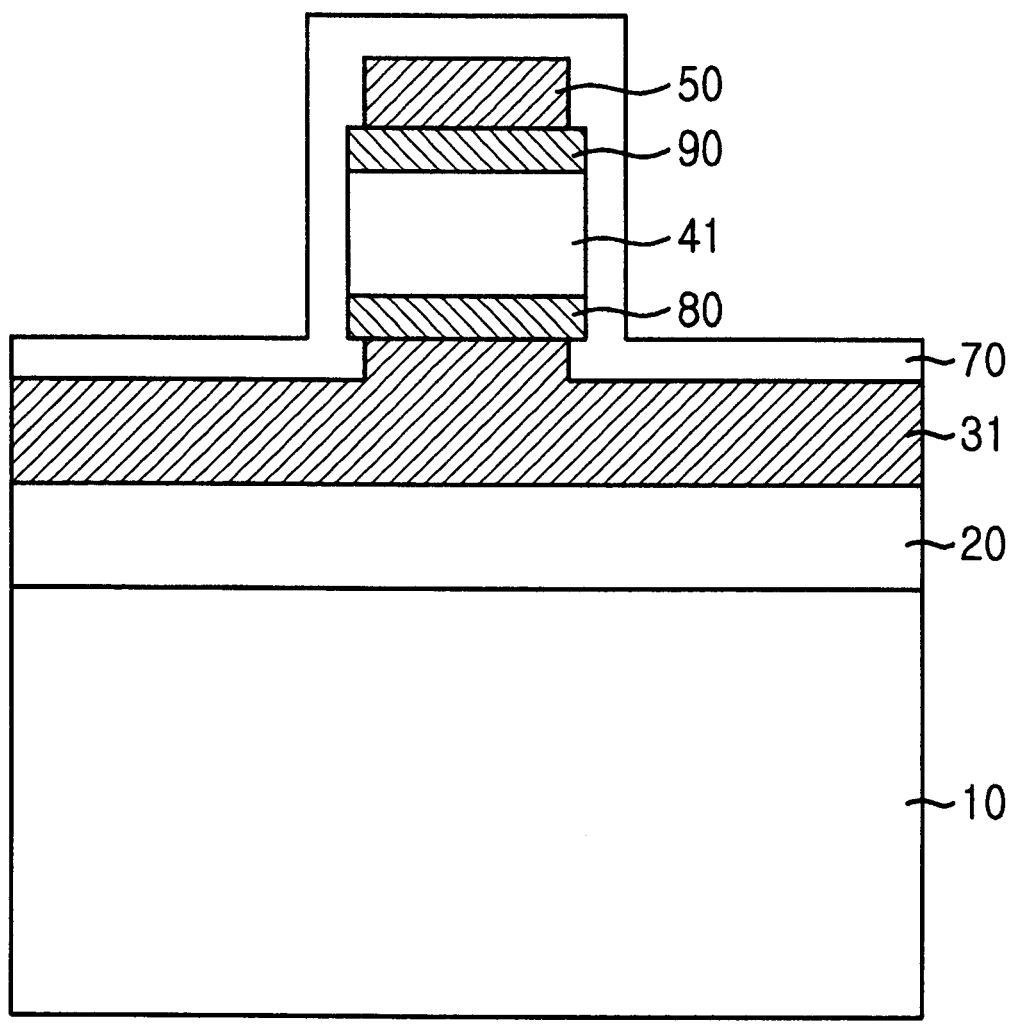

Thereafter, as depicted in FIG. 6, a gate insulating layer 70 is formed on the first silicon conductive layer 31, the second single crystal silicon layer 40 and the second silicon conductive layer 50 in an oxygen rich ambient. At this time, the gate insulating layer 70 is formed at a temperature ranging from approximately 700° C. to approximately 1,000° C. in an electrical furnace or a rapid thermal annealing (RTA) furnace. The gate insulating layer 70 may be made of a thermal oxide layer, a nitride layer, a CVD oxide layer or a CVD nitride layer.

Then, an annealing process is carried out to diffuse the impurities existing in the first silicon conductive layer 31 and the second silicon conductive layer 50 into the second single crystal layer 40, thereby forming a source region 80, a drain region 90 and a channel 41. At this time, a length of the channel can be determined by modulating a diffusion depth of the impurities by means of a condition of a post annealing process. That is, in case of shortening the length of the channel 41 of the transistor, the annealing process should be carried out at a high temperature for a long time so that the diffusion depth increases and the length of channel 41 is shortened. Meanwhile, when the annealing process is carried out at a low temperature for a rapid time, the diffusion depth decreases to lengthen the length of the channel 41.

Figure 7:
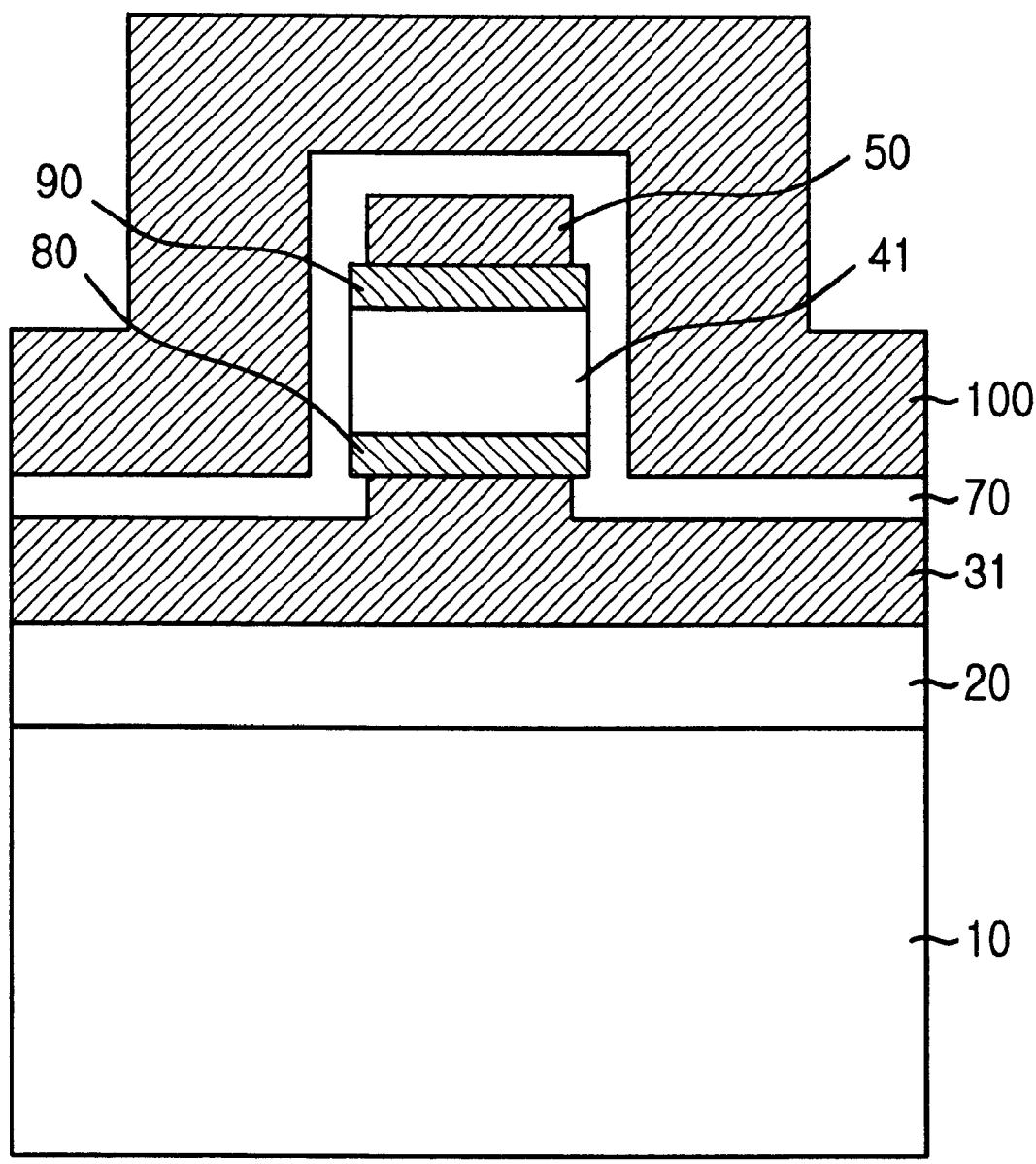

In a next step as shown in FIG. 7, a third silicon conductive layer 100 is formed on top of the gate insulating layer 70. Here, the third silicon conductive layer 50 is also made of an amorphous silicon or a poly-crystal silicon having the impurity such as the p-typed material or the n-typed material by using the CVD technique.

Figure 8:
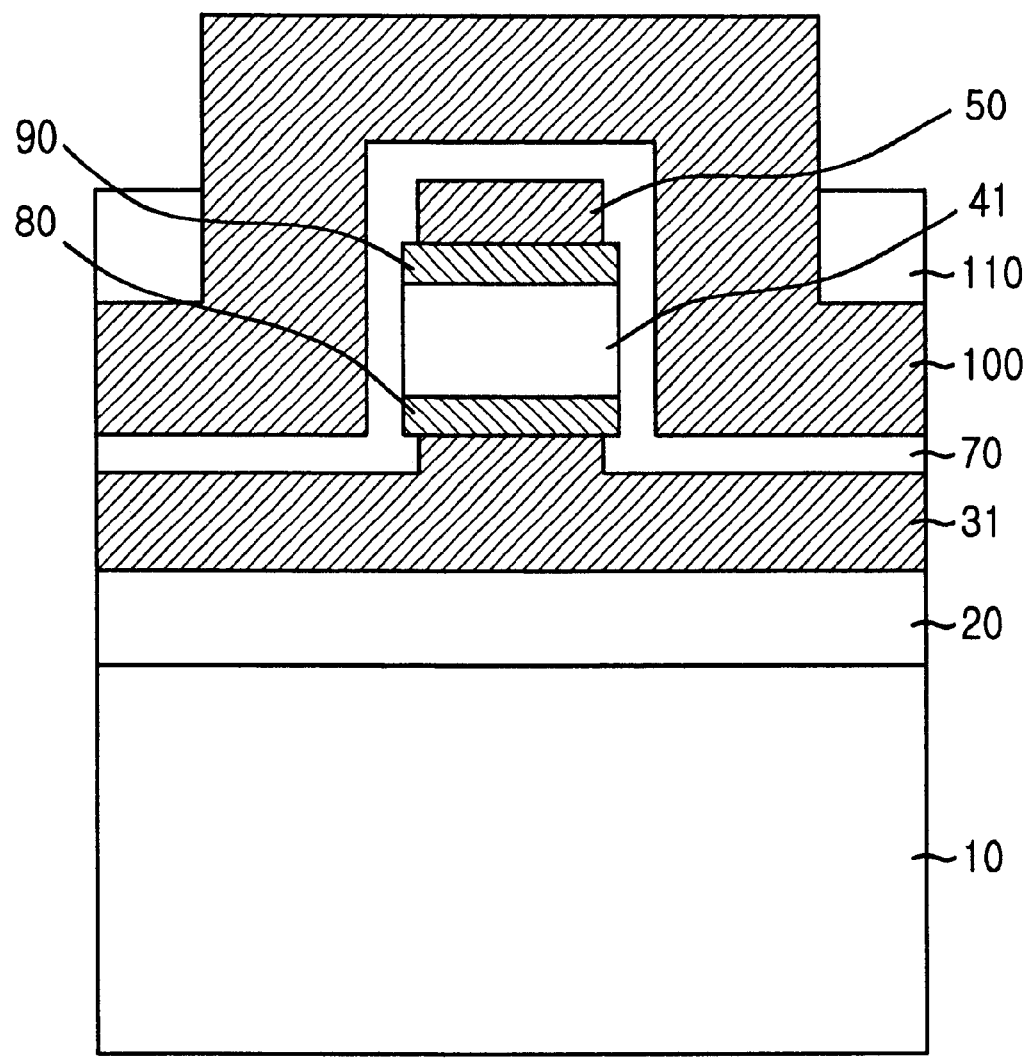

In an ensuing step, a first ILD layer 110 is deposited on the third silicon conductive layer 100 and patterned into a second predetermined configuration, as shown in FIG. 8.

Figure 9:
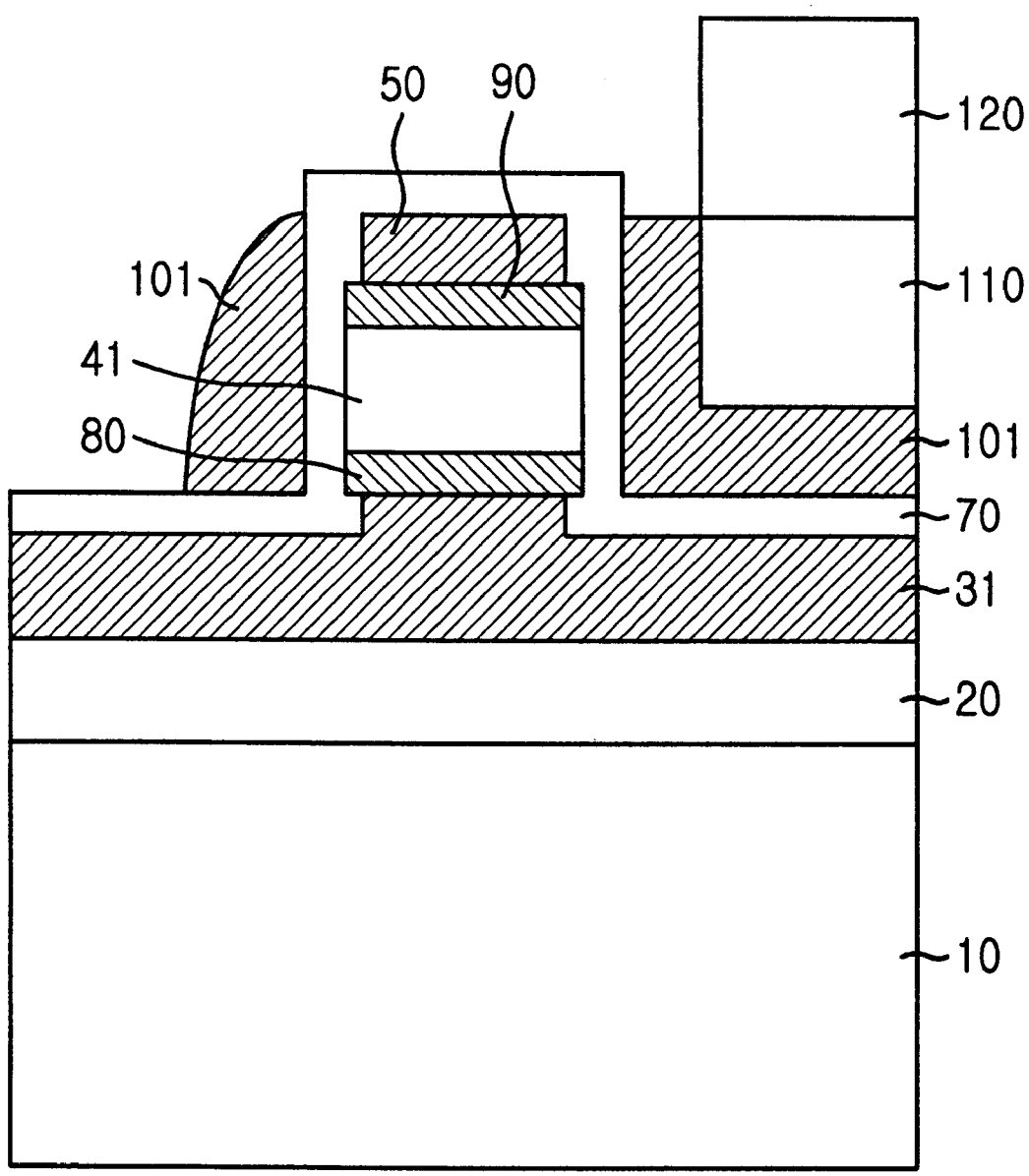

In a subsequent step, dry etch process is carried out to form a gate electrode 101 on side walls of the channel by using an etch mask 120 formed upon a portion of the first ILD layer 110. Therefore, the gate electrode 101 encompasses the channel 41 as shown in FIG. 9.

Figure 10:
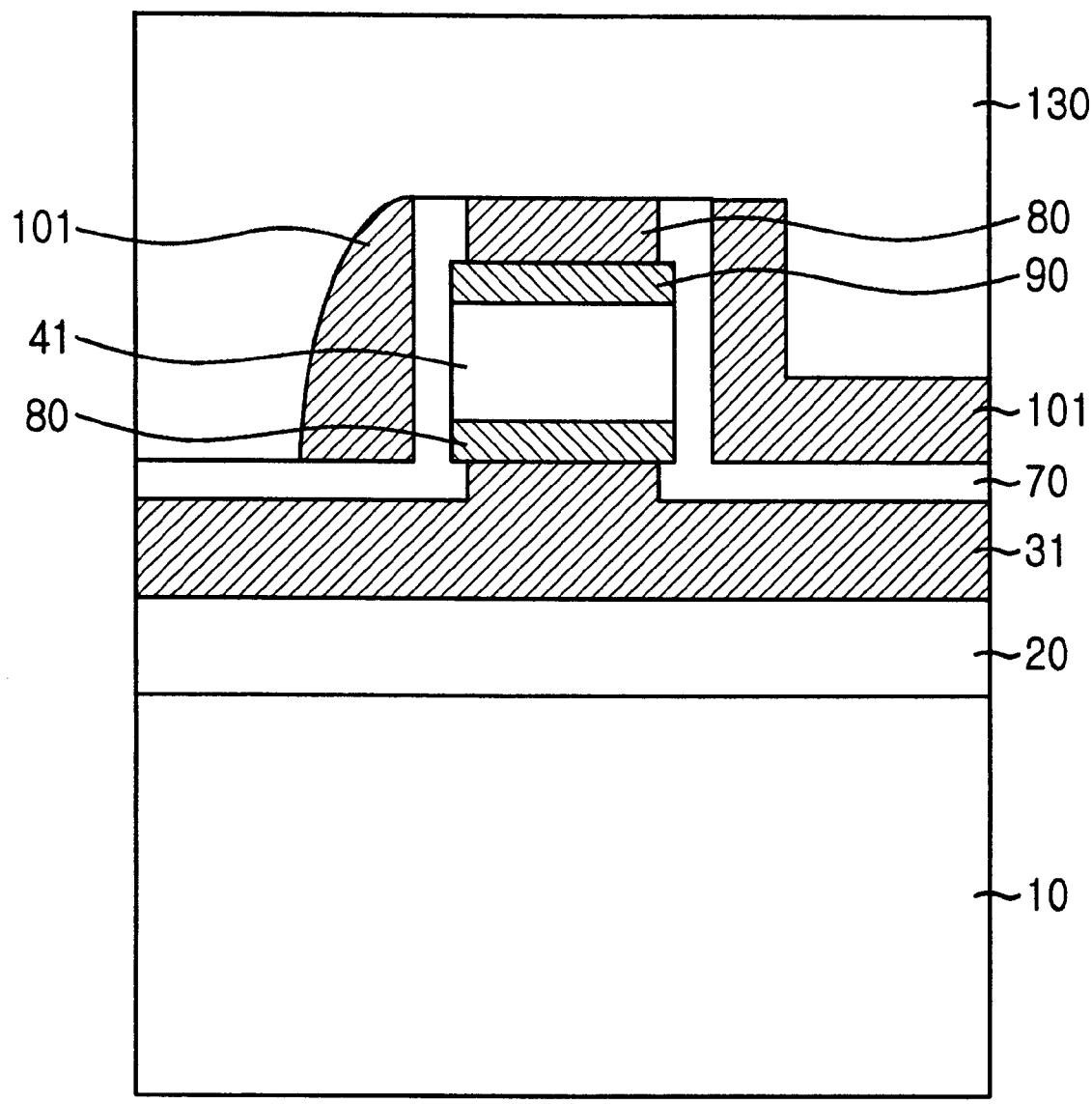

Subsequently, after the etch mask 120 and a remained first ILD layer 110 are removed, a second ILD layer 130 is formed upon entire surfaces including the gate electrode 101, the second silicon conductive layer 50 and the gate oxide layer 70, as shown in FIG. 10.

Finally, a source contact hole, a drain contact hole and a gate electrode contact hole are formed by patterning the second ILD layer 130 into a third predetermined configuration, as shown in FIG. 11. Then, a source interconnection 140, a drain interconnection 150 and a gate electrode interconnection 160 are formed by depositing a metal or a silicon conductive layer into the contact holes.

In comparison with the prior art, the present invention provides the ultra small size channel formed by using the diffusion process instead of a conventional photomask and lithography process. Thus, the channel size can be controlled by means of the condition of the diffusion process. In addition, it is unnecessary to carry out the photomask, the lithography, the ion implantation and the impurity-doping process to form the source/drain structure so that whole the manufacturing processes may be simplified. Since there is not happened any crystal defect during the ion implantation or the annealing process for activating the impurities, a reliability of the inventive MOSFET device may be enhanced.

Moreover, as the vertical channel is formed in the present invention, a width of an effective channel increases in spite of the same area of a chip on the substrate, whereby a high drivability device can be embodied. As SOI substrate is utilized in the present invention, a leakage current may be reduced without a formation of an isolation region.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An ultra small size vertical MOSFET (metal oxide semiconductor field effect transistor) device, comprising:
   a silicon on insulator (SOT) substrate including a single crystal substrate, an oxide layer formed upon the single crystal substrate and a first single crystal silicon layer formed upon the oxide layer;
   a first silicon conductive layer formed by doping an impurity of a high concentration into the first single crystal silicon layer;
   a second single crystal silicon layer formed with an impurity of a low concentration on the first silicon conductive layer;
   a second silicon conductive layer formed with an impurity of a high concentration on the second single crystal silicon layer;
   a source region, a channel and a drain region vertically formed in the second single crystal silicon layer, wherein the source region is directly formed under the channel and the drain region is directly formed above the channel, respectively;
   a gate insulating layer formed on the second silicon conductive layer and at side walls of the source/drain regions and the channel; and
   a gate electrode formed on side walls of the channel.

2. The MOSFET device as recited in claim 1, further comprising:
   an interlayer dielectric (ILD) layer formed on the gate electrode and the gate insulating layer; and
   a source, a drain and a gate electrode interconnections to be connected with the source region, a drain region and the gate electrode.

3. The MOSFET device as recited in claim 1, the source/drain regions and the channel are formed by annealing process after forming the second single crystal silicon layer and the second silicon conductive layer on the first silicon conductive layer.

4. The MOSFET device as recited in claim 3, the annealing process is carried out in a temperature ranging from approximately 700° C. to approximately 1,000° C. in a furnace selected from the group consisting of an electrical furnace and a rapid thermal annealing (RTA) furnace.

5. The MOSFET device as recited in claim 3, wherein the second single crystal silicon layer is formed by using a method selected from the group consisting of a chemical vapor deposition (CVD) and a molecular beam epitaxy (MBE) technique.

6. The MOSFET device as recited in claim 5, wherein the second conductive layer is formed using a material selected from the group consisting of an amorphous silicon and a poly-crystal silicon by the CVD technique.

7. The MOSFET device as recited in claim 1, wherein the gate insulating layer includes a material selected from the group consisting of a thermal oxide layer, a nitride layer, a CVD oxide layer and a CVD nitride layer.

* * * * *